(12) United States Patent
Wong

(10) Patent No.: US 7,352,573 B2
(45) Date of Patent: Apr. 1, 2008

(54) POWER SUPPLY UNIT WITH PERFORATED HOUSING

(75) Inventor: William Wong, Milton Keynes (GB)

(73) Assignee: High Performance Enterprise Public Limited Company, Milton Keynes (GB)

( * ) Notice: Subject to any disclaimer, the term of this patent is extended or adjusted under 35 U.S.C. 154(b) by 219 days.

(21) Appl. No.: 11/246,650

(22) Filed: Oct. 6, 2005

(65) Prior Publication Data

US 2007/0081306 A1 Apr. 12, 2007

(51) Int. Cl.
*H05K 7/20* (2006.01)
(52) U.S. Cl. .................. 361/695; 361/690; 361/692; 361/694; 361/818
(58) Field of Classification Search .................. None
See application file for complete search history.

(56) References Cited

U.S. PATENT DOCUMENTS

| | | | |
|---|---|---|---|
| 5,546,273 A * | 8/1996 | Harris | 361/697 |
| 5,793,608 A * | 8/1998 | Winick et al. | 361/695 |
| 6,307,742 B1 * | 10/2001 | Diaz et al. | 361/683 |
| 6,567,276 B2 * | 5/2003 | Kopf et al. | 361/818 |
| 6,671,186 B2 * | 12/2003 | Kopf | 361/818 |
| 6,930,883 B2 * | 8/2005 | Hsieh et al. | 361/695 |
| 7,097,556 B2 * | 8/2006 | Su | 454/184 |
| 7,106,586 B2 * | 9/2006 | Yu et al. | 361/690 |
| 7,173,822 B2 * | 2/2007 | Liang et al. | 361/695 |
| 2004/0066622 A1 * | 4/2004 | Wang | 361/695 |
| 2005/0018399 A1 * | 1/2005 | Shimizu | 361/695 |
| 2005/0030711 A1 * | 2/2005 | Tsai | 361/687 |
| 2005/0083650 A1 * | 4/2005 | Yang | 361/687 |
| 2006/0023422 A1 * | 2/2006 | Shum et al. | 361/695 |

* cited by examiner

*Primary Examiner*—Boris Chervinsky
(74) *Attorney, Agent, or Firm*—Harrington & Smith, PC

(57) ABSTRACT

A power supply unit (PSU) has walls which define an internal volume of the PSU. A metal sheet forming left and right side walls and an upper wall is provided with plural perforations on each of those walls. The perforations are circular in shape, and formed in a regular grid pattern. The perforations are formed by punching the metal sheet before it is bent into shape. The perforations in the housing of the PSU allow hotspots to be carried through the walls of the housing of the PSU, following which the hotspots are unable to damage internal components of the PSU. This allows the use of reduced flow rate fans.

20 Claims, 5 Drawing Sheets

Right wall 12

POWER SUPPLY UNIT WITH PERFORATED HOUSING

FIELD OF THE INVENTION

This invention relates to a power supply unit.

BACKGROUND OF THE INVENTION

It is well known to provide computing devices such as personal computers (PCs), servers, media centers and the like with power supply units (PSUs). A PSU receives mains electricity, and provides regulated direct current (DC) power at one or more outputs. Since different components of computing devices have different power supply requirements, it is usual to provide at different outputs power at different voltages and with different maximum power ratings.

A PSU typically comprises a cuboid housing made of a metallic sheet material. The metal prevents electromagnetic interference outside of the housing, which interference may negatively affect the operation of other components in the computing device. The housing houses components including one or more transformers and one or more rectifiers which convert mains power, received via a mains power connector mounted in one side wall of the housing, into the required power supplies.

The side wall of the housing with the mains power connector is often also provided with an on/off switch. This wall is then supported in or against an aperture of a casing of the computing device when installed, so as to allow a mains power cable to be connected to the PSU. This makes it convenient for the wall also to be used to allow air to be expelled from the interior of the PSU housing.

The total power supplied by a PSU typically is of the order of hundreds of Watts. The components required to generate such power necessarily generate waste heat within the housing which needs to be removed. Three different types of arrangement can be used to achieve this. Each uses one or two fans.

A fan includes a motor and a fan shroud comprising blades mounted on a support and rotatable by the motor. The fan shroud in generally circular, and rotation of it by the motor causes air to be forced in a direction perpendicular to the plane of the fan component. A fan is supported next to an aperture in a wall of the housing. The aperture is about the same size and shape as the fan component. To prevent a user's fingers or similar being contactable with the blades of the fan, a grill is normally secured to the housing so as to cover the aperture without restricting significantly the flow of air through the fan aperture. This grill also provides grounding to prevent electromagnetic interference (EMI).

In one type of arrangement, two fans are provided, a first fan being supported with the upper wall and a second fan being supported with the side wall in which the mains connector is provided. In this type of arrangement, the first fan blows inwards of the PSU and the second fan blows outwards. As a result, air flows into the PSU through the upper wall, is heated by the internal components of the PSU and the heated air then is expelled by the second fan to the exterior of the housing of the computing device. To minimise the influx of air heated by the components of the PSU into the housing of the computing device containing the PSU, the PSU housing in such an arrangement is not provided with apertures, although a small amount of heated air will sometimes be able to escape the PSU around connectors, wire harness exit apertures and the like. Heat also is conducted through the walls of the housing.

In another type of arrangement, a PSU includes a fan in the side wall that includes the mains power connector, and no other fans. The fan is arranged to blow outwards of the PSU. To allow air to enter the PSU, the side wall opposite the side wall including the mains power connector is provided with apertures. Thus, the fan produces a reduction in air pressure within the PSU housing. Air then flows through the apertures by virtue of higher pressure air in the computing device housing, is heated by the PSU components and is expelled to atmosphere by the fan. To produce maximum cooling for a given fan throughput, the other side walls and the upper wall of the PSU housing are not usually provided with apertures. This maximises the amount of air expelled by the fan being air which has passed over a heat-generating component of the PSU. The SilentX 300W PSU produced by Ahanix is one example of this type of arrangement. This PSU includes a series of parallel elongate slits some tens of mm long and a few mm wide in the side wall opposite the side wall which includes the mains power connector.

In a third type of arrangement, a single fan is included on an upper wall of the PSU and is arranged to blow inwards of the PSU. In this case, an exit for air is provided on the side wall which includes the mains power connector. This exit can take any of a number of different forms, for example a grill. The other side walls are not provided with apertures, which enhances the channelling of air over the heat-generating components of the PSU. One example is the FSP300-60GLS produced by the FSP group of Taiwan. This PSU has a mesh on the side wall on which the mains connector is formed. The mesh allows air forced into the PSU by the fan to be expelled to the exterior of the housing of the computing device in which it is included.

In a fourth type of arrangement, an inwardly blowing fan is provided on the rear faces, and an outwardly blowing fan is provided on the front face. This makes the housing a tunnel through which air is blown.

In a fifth type of arrangement, inwardly blowing fans are provided on both upper and rear faces, and an outwardly blowing fan is provided on the front face. This arrangement tends to be effective, but requires three fans so is more expensive.

It is known also to use two fans mounted adjacent one another in one wall of the PSU housing. These fans then operate in parallel, and can be considered to be equivalent to a single fan of greater capacity mounted in that wall of the PSU housing.

It is known in some multiple fan PSUs to include a small number of elongate slits over an area of a side wall. Such slits serve to compensate for any differences in the rate of air entering and leaving the housing by way of the fans. Thus, if inwardly blowing fans have a greater flow rate than outwardly blowing fans, then the slits allow air to leave the housing of the PSU. Without the slits, the inwardly blowing fans would be more stressed. Similarly, if outwardly blowing fans have a greater flow rate than inwardly blowing fans, then the slits allow air to enter the housing of the PSU. Without the slits, the outwardly blowing fans would be more stressed.

Fanless PSUs are known, but suffer from certain disadvantages.

Although in a conventional fan PSU one or more fans are used to circulate air through the PSU, the presence of internal components means that it is not always possible to ensure that there is sufficient air movement in all of the volume formed by the housing. As such, it is possible for air in some locations to be heated to a temperature significantly above the average air temperature within the housing. Such heated air is termed a hotspot. Since hot air is less dense than cooler air, hotspots move once formed. When a hotspot moves to a location where there is a temperature sensitive material or component, such as the plastic insulation of a wire, the plastic of a connector or a packaged semiconductor device, that material or component can become damaged. Since hotspots usually rise within the PSU, damage is most likely to occur to components located near the upper wall of the housing.

The formation of hotspots can cause a fan PSU to cease working correctly, and in some cases cease functioning altogether. For this reason, fan PSU designers choose fans having flow rates sufficiently high to reduce the probability of hotspots forming and causing damage to a minimum. This normally means that the flow rates of the fans are higher than would be the case if hotspots could not cause problems. However, higher flow rate fans are generally more expensive and/or noisier than lower flow rate fans. Thus, the need to avoid hotspots increases to the cost of fan PSUs and/or the noise levels that are generated by them.

SUMMARY OF THE INVENTION

According to a first aspect of the invention, there is provided a power supply unit for a computing device, the power supply unit comprising a housing, the housing having a generally cuboid shape with upper, lower and first to fourth side walls, wherein the upper wall of the housing is provided with holes over at least 50% of the area of the upper wall, disregarding any area of the upper wall constituting a fan aperture, wherein each hole has a maximum dimension through a centre point of the hole of 5 mm, and wherein a distance between the centres of adjacent holes is no greater than 10 mm.

According to a second aspect of the invention, there is provided a power supply unit for a computing device, the power supply unit comprising:
  a mains power supply input including a mains connector;
  at least one direct current power supply output each including a respective connector;
  a transformer, the transformer being arranged to transform a mains electricity supply received at the mains electricity supply input and having a mains electricity supply voltage into at least one transformed electricity supply, the at least one transformed electricity supply having a voltage lower than the mains electricity supply voltage;
  at least one rectifier, the at least one rectifier being arranged to convert the at least one transformed electricity supply into a rectified electricity supply for supply to the at one direct current power supply output;
  a housing, the housing having a generally cuboid shape with upper, lower and first to fourth side walls, in which at least one of the upper and first to fourth side walls includes a fan aperture formed therein and the power supply unit includes at least one fan,
  wherein each fan:
    has a fan shroud residing generally in a fan shroud plane and being operable to force air in a direction generally perpendicular to the fan shroud plane;
    is associated with a respective fan aperture; and
    is supported substantially in register with its respective fan aperture, wherein the upper wall of the housing is provided with holes over at least 50% of the area of the upper wall, disregarding any area of the upper wall constituting a fan aperture, wherein each hole has a maximum dimension through a centre point of the hole of 5 mm, and wherein a distance between the centres of adjacent holes is no greater than 10 mm.

The holes in the walls of the housing allow air to pass from the interior of the PSU housing to the exterior. This is disadvantageous in so far as it reduces the effectiveness of the channelling of air over heat-generating internal components of the PSU to atmosphere. However, the inventors consider this to be an acceptable disadvantage in light of the function of the holes to remove hotspots within the PSU housing.

Since the holes reduce the formation of hotspots, the use of holes allows the use of reduced flow rate fans. This in turn reduces the cost of the PSU and/or the noise levels generated by the PSU. Preferably the holes are perforations.

Preferably at least three of the upper and first to fourth walls of the housing is provided with holes over at least 50% of the area of that wall Optionally, at least three walls include the upper wall and first and second side walls which are adjacent the side wall which includes the mains power connector.

Conveniently, the holes can be generally circular.

The distance between a centre point of a first hole and a centre point of an adjacent hole may be between 1.1 and 2 times the maximum width of the first hole. Preferably, the distance between a centre point of a first hole and a centre point of an adjacent hole is approximately 1.5 times the maximum width of the first hole. Having closely packed holes allows relatively free movement of air and thus helps prevent hotspots.

The holes may be in the range of 1 mm to 3 mm in diameter.

The holes may be formed in regular parallel lines.

The holes on at least one of the walls preferably are provided over at least 80% of the area of the wall.

Conveniently, the holes may be formed by perforating a metal sheet.

An embodiment of the invention will now be described, by way of example only, with reference to the accompanying drawings.

DETAILED DESCRIPTION OF THE EMBODIMENTS

Figure 1:
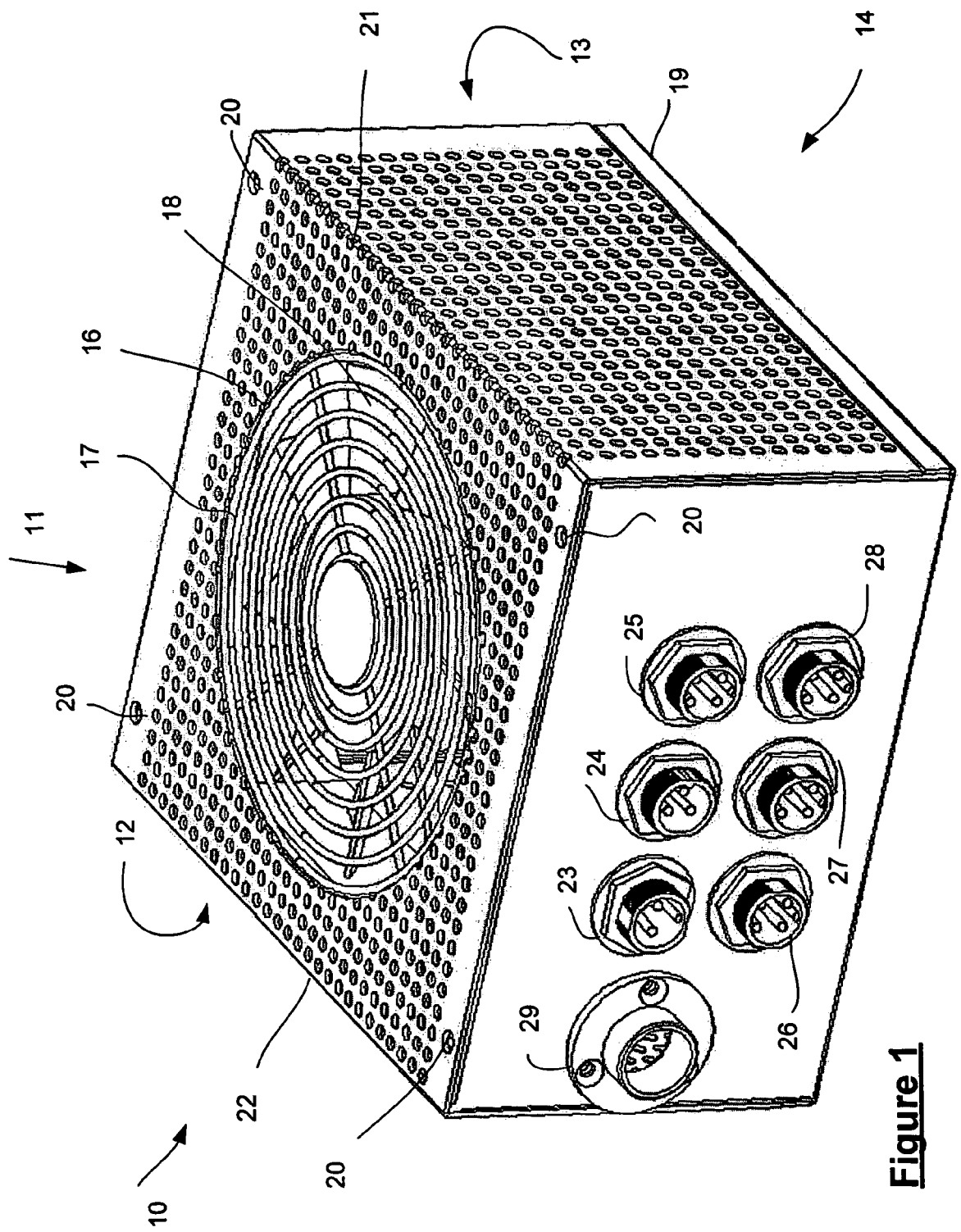
FIG. 1 is a perspective view of a power supply unit according to the invention.

In FIGS. 1 to 5, like reference numerals refer to like elements.

Referring to FIG. 1, a power supply unit (PSU) 10 according to the invention is generally cuboid in shape and has a top or upper wall 11, a right side wall 12 (not visible in FIG. 1), a front wall 13 (not visible in FIG. 1), a left side wall 14, a rear wall 15 and a bottom wall (not shown). The rear and front walls 13, 15 can be referred to as side walls since they are at the side of the PSU 10. The walls 11-15 define an internal volume of the PSU 10.

The upper wall 11 has formed therein a circular aperture 16, which constitutes a fan aperture. Supported on the upper wall 11 of the PSU 10 is a fan aperture cover 17. This is the same shape and size as the fan aperture 16, and is screwed to the upper wall 11. The fan aperture cover 17 comprises a number of circular metal. components connected together by radial metal spokes. The fan aperture cover 17 prevents the ingress of a user's fingers through the fan aperture 16. A first fan 18 is supported just behind the fan aperture cover 17. The first fan 18 includes a number of blades (visible more clearly in FIG. 2) supported in a fixed relation to one another. The diameter of the first fan 18 is approximately the same as the diameter of the fan aperture 16.

The front, back and bottom walls 13, 15 are formed from a first bent metal sheet. Extending either side of the bottom wall is a tab, one of which is shown at 19. The tabs are bent perpendicularly to the bottom wall so as to lie in the plane of their respective side wall 14. The tabs extends for the whole of the length of their respective side wall 14. These tabs are between 5 mm and 10 mm wide.

The left and right side walls 12, 14 and the upper wall 11 are formed from a second metal sheet bent into shape. A first edge 21 separates the right side wall 14 from the upper wall 11. A second edge 22 separates the left side wall 12 from the upper wall 11.

The first metal sheet also includes tabs (not shown) at the uppermost ends of the front and back walls 13, 15. These tabs are between 5 mm and 10 mm wide. The tabs are bent into the plane of the upper wall 11. Each of these tabs is included with two threaded holes. Screws 20 are inserted through corresponding holes in the upper wall 11 and screwed into the threaded holes, so as to secure the second metal sheet to the first metal sheet. A lower end of the right side wall 14 is located inwards of the tab 19. This eliminates the need for separate fixings at the lower end of the right side wall. The lower end of the left side wall is similarly secured behind a corresponding tab (not shown).

Mounted in the rear wall 15 are first to sixth power connectors 23 to 28. Electrical power at low DC Voltages is provided at these connectors. Power is also provided through a wire harness (not shown) extending through a harness support 29.

The second metal sheet, forming the left and right side walls 12, 14 and the upper wall 11, and the first metal sheet, forming the front, back and bottom walls 13, 15, together comprise a housing of the PSU 10. Through its construction, the housing is rigid.

In accordance with the invention, the second metal sheet is provided with plural perforations on each of the left and right side walls 12, 14 and the upper wall 11. The perforations are circular in shape. The perforations are formed in a regular grid pattern. The diameter of the perforations in this embodiment is 2 mm. The distance between the centre points of adjacent perforations is 3 mm. The perforations are formed by punching the second metal sheet before the sheet is bent into shape.

The perforations do not affect the ability of the housing to prevent the escape of EMI.

Figure 2:
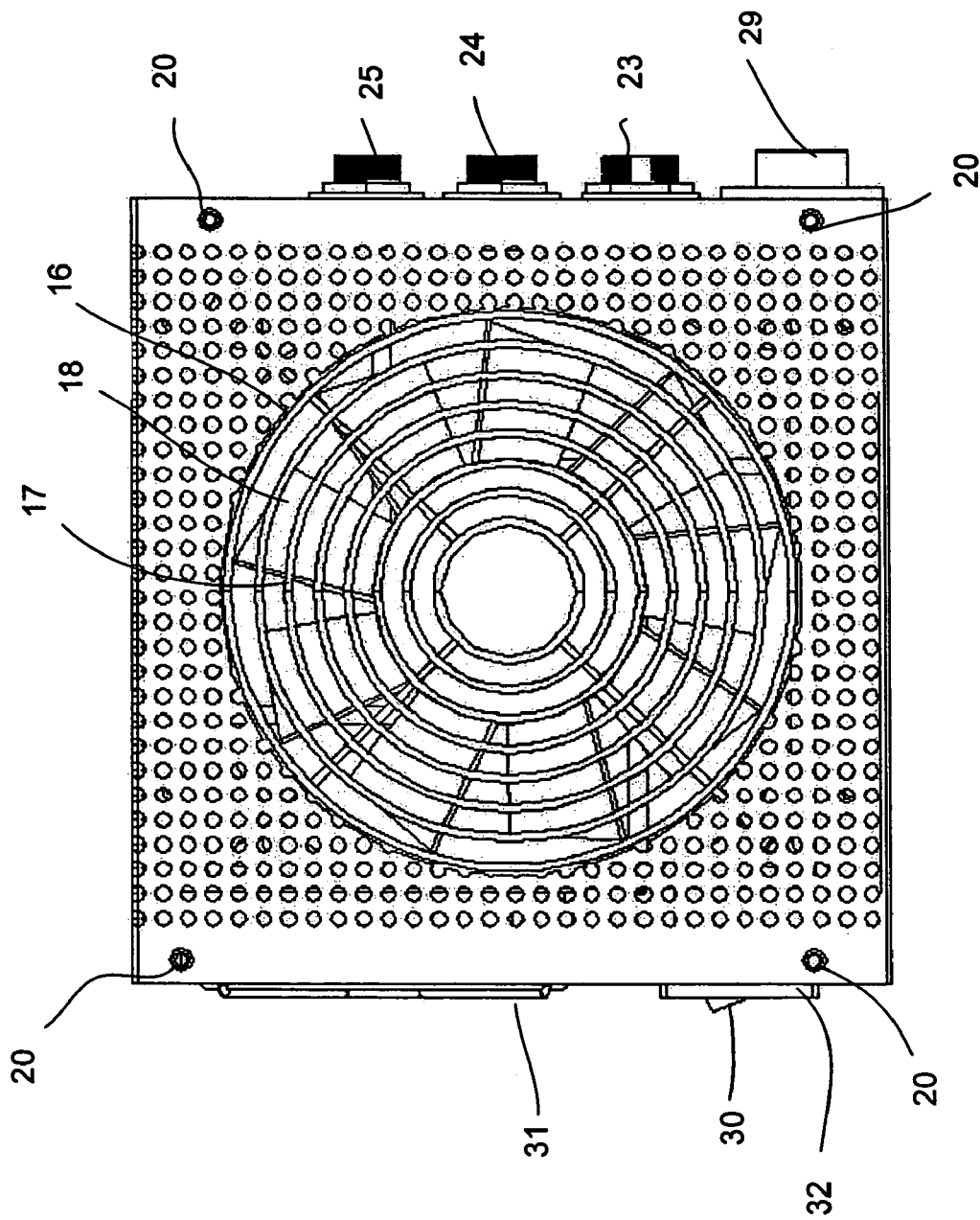
FIG. 2 is a plan view of the FIG. 1 power supply unit.

Referring to FIG. 2, the upper wall 11 is shown. Blades of the first fan 18 are clearly visible through the fan aperture cover 17. The arrangement of the fan aperture cover 17 also is clearly visible. The centre part of the fan aperture cover 17 does not need to have only small apertures since this is where a motor of the fan is present. Also visible in FIG. 2 is a rocker power switch 30 and a mains power connector 32, both of which are mounted in the front wall 13. Connected to the front wall 13 is a second fan cover 31.

As shown in FIG. 2, the perforations in the second metal sheet are provided over almost all of the surface of the upper wall 11. Except for the fan aperture 16, where there is no metal sheet and thus no perforations could be included, and narrow margins where the tabs included as part of the first metal sheet overlap with the second metal sheet, the perforations cover the entire area of the upper wall 11. It can be said that the perforations cover the entire useful area of the upper wall 11.

Figure 3:
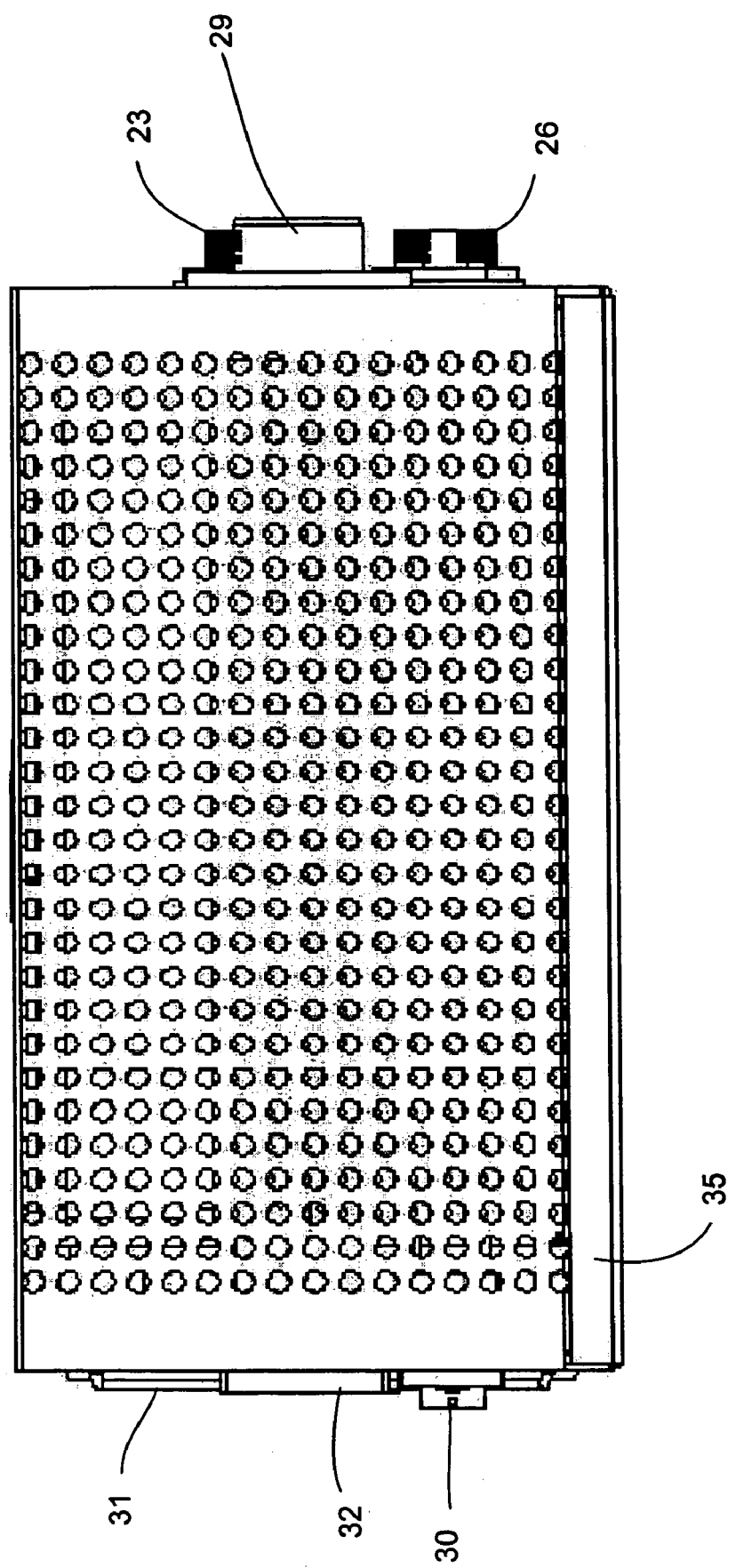
FIG. 3 is a right side view of the FIG. 1 power supply unit.

Referring now to FIG. 3, the right side wall 12 is shown. A tab 35 is formed with the first metal sheet. The bottommost part of the second metal sheet is secured behind the tab 35.

As shown in FIG. 3, the perforations in the second metal sheet are provided over almost all of the surface of the right side wall 12. Except for narrow margins at the edges of the right side wall 12 adjacent the front and back walls 13, 15, the perforations cover the entire area of the right side wall 12. It can be said that the perforations cover over 90% of the entire useful area of the right side wall 12. The margins at the edges of the right side wall 12 adjacent the front and back walls 13, 15 are the same width as the margins on the upper wall 11 of the PSU 10.

Figure 4:
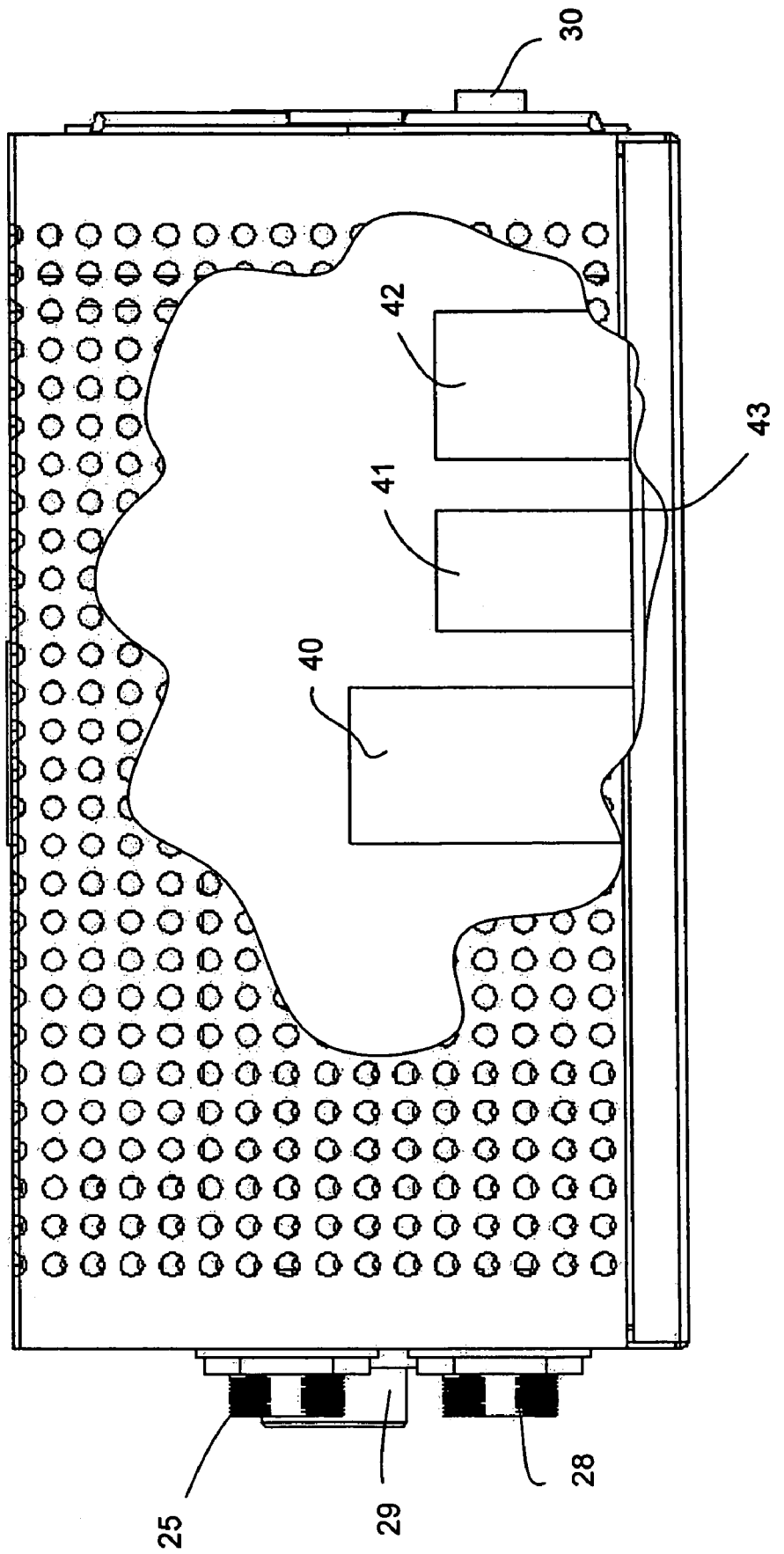
FIG. 4 is a left side view of the FIG. 1 power supply unit with a cutaway portion revealing internal components thereof.

FIG. 4 is a view of the left side wall 14. A portion of the left side wall 14 is cutaway to reveal components housed within the PSU 10. A tab which is formed with the first metal sheet is shown at 36. The bottommost part of the second metal sheet is secured behind the tab 36.

As shown in FIG. 4, the perforations in the second metal sheet are provided over almost all of the surface of the left side wall 14. Except for narrow margins at the edges of the right side wall 14 adjacent the front and back walls 13, 15, the perforations cover the entire area of the left side wall 14. It can be said that the perforations covet over 90% of the entire useful area of the left side wall 14. The margins at the edges of the left side wall 14 adjacent the front and back walls 13, 15 are the same width as the margins on the upper wall 11 of the PSU 10.

Through the cutaway part of the left side wall 14, a transformer 40, a rectifier 41 and other components 42 are shown mounted on a circuit board 43. These components server to convert mains electricity received via the mains power connector 32 into DC power at lower Voltage, and supply the result to the first to sixth power connectors 23 to 28, as well as to wires of the harness extending through the harness support 29. The operation of the PSU 10 may be controlled by operation of the rocker switch 30 by a user. When switched off, the PSU 10 powers-down and ceases providing power. A relay and capacitor arrangement (not shown) provide power to the fan for a while after the PSU 10 is switched-off, so as to provide further cooling. The components within the PSU 10 may be conventional.

Figure 5:
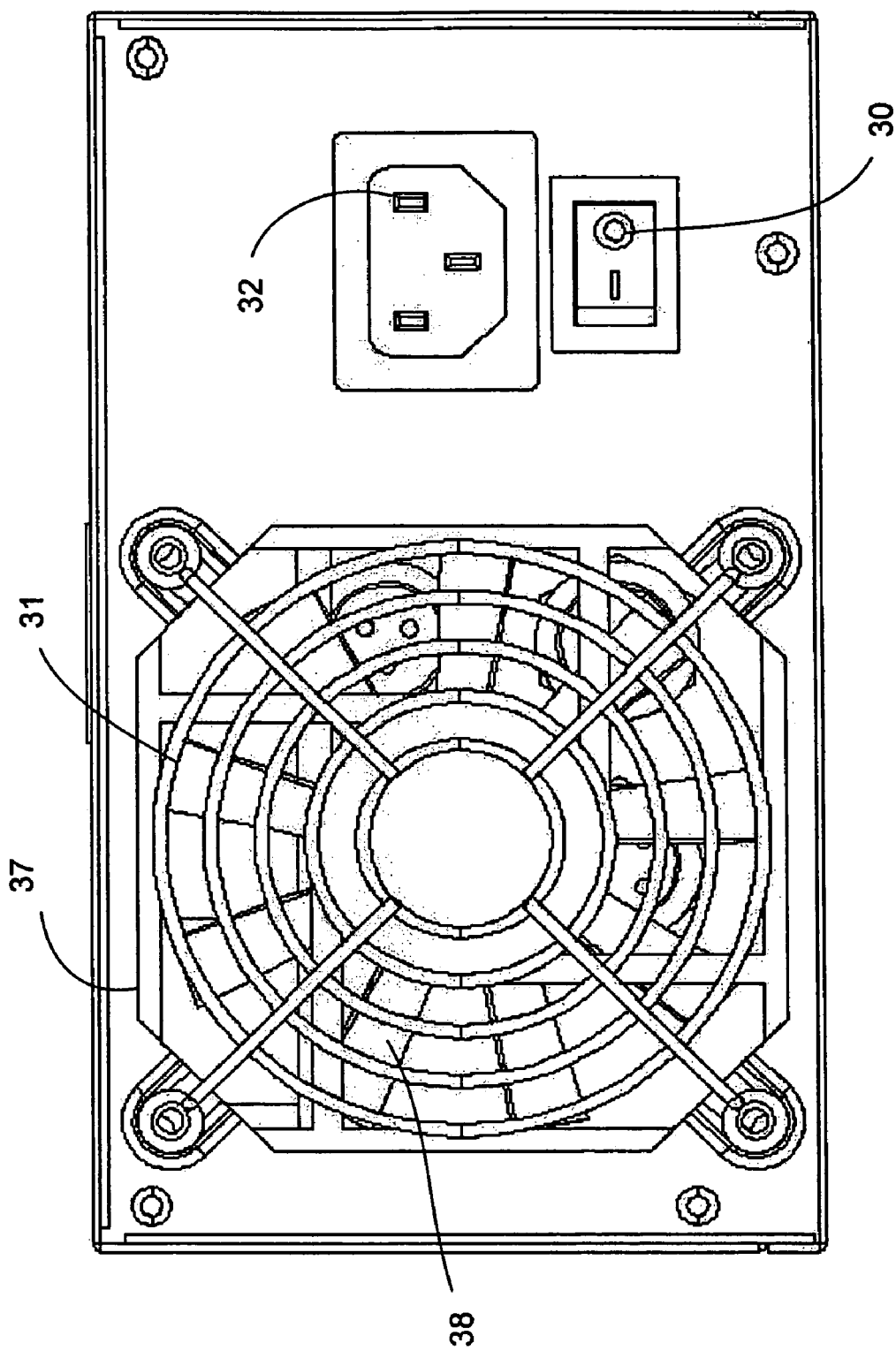
FIG. 5 is a front view of the FIG. 1 power supply unit.

FIG. 5 shows the front wall 13. The mains power connector 32 can be seen to be of the standard type used for PSUs, having three pins arranged in a triangular arrangement, although any other type of mains connector may be used instead. The second fan cover 31 can be seen to be generally in register with a second fan aperture 37. In turn, the second fan aperture 37 is generally in register with a second fan 38, which is supported within the housing of the PSU 10. The front wall is not provided with perforations.

The arrangement of the first and second fans 18 and 38 will now be discussed. The first fan 18 is arranged to blow inwards of the PSU 10. The first fan 18 thus blows air onto the transformer 40, the rectifier 41 and the other components 42 mounted on the circuit board 43. The second fan is arranged to blow outwards of the housing. The second fan 38 thus blows air from the inside of the housing to the outside thereof.

When installed within a casing of a computing device such as a PC or a server, the upper wall 11 of the PSU 10 is placed horizontally facing upwards. The upper wall 11 typically is exposed to the internal volume of the computing device. Accordingly, air blown by the first fan 18 into the PSU 10 typically is air which has been warmed slightly by other components of the computing device, but still is air which is relatively cool compared to the air within the housing of the PSU 10. The front wall 13 of the housing of the PSU 10 typically is mounted adjacent a corresponding aperture in the housing of the computing device. This ensures that air blown by the second fan 38 is blown to atmosphere. This thereby ensures that air heated by the internal components of the PSU 10 is blown to atmosphere, not to the internal volume of the computing device.

The flow rates of the first and second fans can be approximately equal. This helps direct air smoothly through the PSU 10, and does not encourage heated air to be vented to the housing of the computing device.

Preferably, though, the first fan 18 is controllable to adopt one of a number of speed settings. The speed setting of the first fan 18 is automatically adjusted on the basis of a signal provided by a thermal sensor (not shown) mounted on the circuit board 43.

When the PSU 10 is not running hot, as indicated by the thermal sensor, the first fan is controlled to adopt a low flow setting. In this low setting, the flow rate of the first fan is less than the flow rate of the second fan 38. As a result, the air pressure within the housing of the PSU 10 is lower than the pressure outside. This causes some air to be entered into the housing through the perforations, following which it is vented to atmosphere by the second fan 38. This has the advantage that the PSU then cools the interior of the housing of the computing device in which it is included.

When the PSU 10 is running hot, as indicated by the thermal sensor, the first fan is controlled to adopt a high flow setting. In this high setting, the flow rate of the first fan is greater than the flow rate of the second fan 38. As a result, the air pressure within the housing of the PSU 10 is greater than the pressure outside. This causes some air to exit the housing of the PSU through the perforations to the interior of the housing of the computing device in which it is included. However, the inventor has found that this results in an increase in the pressure within the computing device housing, which in turn increases the air pressure within the PSU housing and thus increases the difference in pressure across the second fan 38. This results in the flow rate of the second fan 38 being increased, and thus the rate of expulsion of heated air from the interior of the housing of the PSU being increased, providing improved cooling.

The perforations in the housing of the PSU 10 allow hotspots to be carried through the walls of the housing of the PSU, following which the hotspots are unable to damage internal components of the PSU. Whereas in conventional PSUs the walls of the housing might prevent heated air from moving further, thereby encouraging further the build-up of heated air, the movement of heated air is not impeded by the perforated housing of the invention. Since hotspots typically travel generally upwards, a hotspot formed within the PSU typically will pass through the upper wall 11 of the PSU. Thus, the perforations are of most benefit in the upper wall 11.

However, air currents caused by the fans 18, 38 and deflection by components of the PSU 10 can result in over-heated air being directed into contact with the left and right side walls. Whereas with conventional PSUs such heated air would be contained by the housing, the perforations of the invention allow the heated air to escape the PSU and thereby prevent the possibility of the heated air causing damage within the PSU.

The effect of the perforations in preventing hotspots is enhanced when the flow rates of the inward and outward blowing fans differs significantly. In a conventional PSU with slits formed therein, heated air is able to leave the housing only through a fan aperture or a slit, and air is able to move only along but remain within the other parts of the walls of the housing. Thus, hotspots can be allowed to develop or be trapped near the walls of the housing. With the perforated housing of the invention, however, hotspots cannot be constrained by the walls of the housing where the perforations are present and thus are free to exit the PSU 10.

As stated above, the flow rate of one or more fans in a conventional PSU is selected to be higher than would be the case if hotspots could not form. Since the perforations reduce the formation of hotspots, the use of perforations allows the use of reduced flow rate fans. This in turn reduces the cost of the PSU and/or the noise levels generated by the PSU.

The existence of the perforations has a slightly negative effect on the movement of air within the housing of the PSU 10. In particular, the walls of the housing not being solid means that they are less able to deflect air currents. In turn, this makes it possible for air blown by the first fan 18 into the PSU 10 to escape through perforations in the left and right side walls 12, 14 and the upper wall 11 instead of being blown by the second fan 38 to atmosphere. This in turn can result in an increase in the temperature within the housing of the computing device in which the PSU 10 is located, which is undesirable. However, the inventor considers that this disadvantage is outweighed by the hotspot amelioration benefits. Also, the amount of air escaping through the perforations can be minimised by ensuring that the flow rates of the first and second fans are approximately equal.

As well as the above advantages, the perforated housing is considerably more attractive to the eye than a PSU provided with slits.

In other embodiments (not shown), a very similar effect is achieved through the use of a mesh material, instead of a perforated sheet. Here, the mesh material can comprise for instance a first layer of plural metal bars or strips arranged in parallel and slightly separated from one another mechanically and electrically connected to a second layer of metal bars or strips similar to the first and laid perpendicularly thereon. Alternatively, the mesh material may comprise a woven metal arrangement, such as a metal gauze. In either case, the mesh serves to shield against EMI and provide structural strength whilst including many small holes through which hotspots can be allowed to pass.

Although the invention has been described with reference to a number of particular embodiments, the scope of the invention is not limited to these embodiments.

For example, the perforations need not be circular, but may alternatively be oval, square, triangular, irregular or any other suitable shape. Holes formed by a mesh material will normally be generally square, but may instead be any other suitable shape. Preferably the perforations or holes are not elongate, for instance by having a maximum width through a centre point of the perforation less than or equal to twice the minimum width through the centre point of the perforation. The perforations or holes may be of different sizes and shapes, even on a given wall of the housing of the PSU.

The separation of the holes may be varied. Decreasing the distance between holes allows the freer movement of air through the housing but at the expense of reduced strength of the PSU housing. Decreasing the distance between adjacent holes results in increased strength of the housing but reduced movement of air through the housing. The greater the distance between holes, the greater the chance is that hot air constituting a hotspot will not be dissipated quickly by the perforations. Preferably the distance between a centre point of a first hole and a centre point of an adjacent hole is between 1.1 and 2 times the maximum width of the first hole. Preferably the distance between a centre point of a first hole and a centre point of an adjacent hole is approximately 1.5 times the maximum width of the first perforation. If the holes, e.g. perforations, are circular, then the maximum width is the diameter of the hole.

The holes do not need to be 2 mm across. Preferably though the holes are in the range of 1 mm to 3 mm in diameter. Smaller holes are not so effective at preventing hotspots, whereas larger holes more easily allow articles to enter the PSU, which is undesirable.

The holes preferably are formed in regular parallel lines. However, these lines need not form a square grid pattern. For instance, the holes may instead be formed in regular parallel lines in three different directions, each direction being separated from each other direction by approximately 60 degrees.

Holes are formed in the upper wall 11, and preferably are formed in one or both of the left and right side walls 12, 14 aswell although this may not be essential. Providing holes in the rear wall 15 would normally be avoided since this could reduce the efficiency of removal of air from within the housing by the second fan 38. Although not shown, holes may be provided in the front wall 13 in the parts of that wall around the connectors 23 to 28 and the harness connector 29.

To maximum advantage, the holes are formed over as much of the walls as is practicable, although much of the advantages obtained through the holes can be achieved with less hole coverage. Preferably the holes on one or more of the walls are provided over at least 80% of the area of the wall, although the coverage may be as little as 50%.

Although fans are provided in the upper wall 11 and the rear wall 15, fans may instead be provided in any other suitable arrangement. For instance, a first fan may be provided in the rear wall 15 and a second fan may be provided in the front wall 13. In this case, the output connectors 23-28 may be provided instead in the bottom wall 16.

The scope is to be understood to be limited only by the scope and spirit of the invention as defined in the appended claims.

The invention claimed is:

1. A power supply unit for a computing device, the power supply unit comprising a housing, the housing having a generally cuboid shape with upper, lower and first to fourth side walls, wherein the upper wall of the housing is provided with holes over at least 50% of the area of the upper wall, disregarding any area of the upper wall constituting a fan aperture, wherein each hole has a maximum dimension through a centre point of the hole of 5 mm, and wherein a distance between the centres of adjacent holes is no greater than 10 mm.

2. A power supply unit as claimed in claim 1, wherein each of at least three of the upper and first to fourth walls of the housing is provided with holes over at least 50% of the area of the wall.

3. A power supply unit as claimed in claim 1, wherein one of the first to fourth side walls is provided with a first fan and a mains power connector, and a second fan is included in another of the walls of the housing.

4. A power supply unit as claimed in claim 1, wherein the at least three walls include the upper wall and first and second side walls which are adjacent the side wall which includes the mains power connector.

5. A power supply unit as claimed in claim 1, wherein the holes are generally circular.

6. A power supply unit as claimed in claim 1, wherein the distance between a centre point of a first hole and a centre point of an adjacent hole is between 1.1 and 2 times the maximum width of the first hole.

7. A power supply unit as claimed in claim 4, wherein the distance between a centre point of a first hole and a centre point of an adjacent hole is approximately 1.5 times the maximum width of the first hole.

8. A power supply unit as claimed in claim 1, wherein the holes are in the range of 1 mm to 3 mm in diameter.

9. A power supply unit as claimed in claim 1, wherein the holes are formed in regular parallel lines.

10. A power supply unit as claimed in claim 1, wherein the holes on at least one of the walls are provided over at least 80% of the area of the wall.

11. A power supply unit as claimed in claim 1, wherein the holes are formed by perforating a metal sheet.

12. A power supply unit for a computing device, the power supply unit comprising:
   a mains power supply input including a mains connector;
   at least one direct current power supply output each including a respective connector;
   a transformer, the transformer being arranged to transform a mains electricity supply received at the mains electricity supply input and having a mains electricity supply voltage into at least one transformed electricity supply, the at least one transformed electricity supply having a voltage lower than the mains electricity supply voltage;
   at least one rectifier, the at least one rectifier being arranged to convert the at least one transformed electricity supply into a rectified electricity supply for supply to the at one direct current power supply output;
   a housing, the housing having a generally cuboid shape with upper, lower and first to fourth side walls, in which at least one of the upper and first to fourth side walls includes a fan aperture formed therein and the power supply unit includes at least one fan,
   wherein each fan:
      has a fan shroud residing generally in a fan shroud plane and being operable to force air in a direction generally perpendicular to the fan shroud plane;
      is associated with a respective fan aperture; and
      is supported substantially in register with its respective fan aperture, wherein the upper wall of the housing is provided with holes over at least 50% of the area of the upper wall, disregarding any area of the upper wall constituting a fan aperture, wherein each hole has a maximum dimension through a centre point of the hole of 5 mm, and wherein a distance between the centres of adjacent holes is no greater than 10 mm.

13. A power supply unit as claimed in claim 10, wherein each of at least three of the upper and first to fourth walls of the housing is provided with holes over at least 50% of the area of that wall.

14. A power supply unit as claimed in claim 10, wherein the at least three walls include the upper wall and first and second side walls which are adjacent the side wall which includes the mains power connector.

15. A power supply unit as claimed in claim 10, wherein the distance between a centre point of a first hole and a centre point of an adjacent hole is between 1.1 and 2 times the maximum width of the first hole.

16. A power supply unit as claimed in claim 15, wherein the distance between a centre point of a first hole and a centre point of an adjacent hole is approximately 1.5 times the maximum width of the first hole.

17. A power supply unit as claimed in claim 10, wherein the holes are generally circular, and are in the range of 1 mm to 3 mm in diameter.

18. A power supply unit as claimed in claim 10, wherein the holes are formed in regular parallel lines.

19. A power supply unit as claimed in claim 10, wherein the holes on at least one of the walls are provided over at least 80% of the area of the wall.

20. A power supply unit as claimed in claim 10, wherein the holes are formed by perforating a metal sheet.

* * * * *